(12) United States Patent
Tappel et al.

(10) Patent No.: US 7,474,419 B2
(45) Date of Patent: Jan. 6, 2009

(54) STAGE ASSEMBLY, PARTICLE-OPTICAL APPARATUS COMPRISING SUCH A STAGE ASSEMBLY, AND METHOD OF TREATING A SAMPLE IN SUCH AN APPARATUS

(75) Inventors: Hendrik Gezinus Tappel, Casteren (NL); Ian Johannes Bernardus van Hees, Zaltbommel (NL); Danny Lankers, Roosendaal (NL); Gerard Nicolaas Anne van Veen, Waalre (NL); Richard Young, Beaverton, OR (US); Lucille Ann Giannuzzi, Orlando, FL (US)

(73) Assignee: FEI Company, Hillsboro, OR (US)

( * ) Notice: Subject to any disclaimer, the term of this patent is extended or adjusted under 35 U.S.C. 154(b) by 90 days.

(21) Appl. No.: 11/590,583

(22) Filed: Oct. 31, 2006

(65) Prior Publication Data

US 2007/0125958 A1    Jun. 7, 2007

(30) Foreign Application Priority Data

Nov. 1, 2005    (EP)    ................................... 05110225

(51) Int. Cl.
*G01B 11/14*    (2006.01)
(52) U.S. Cl. ........................ 356/614; 356/615; 356/620; 356/621
(58) Field of Classification Search .................. 356/614, 356/615, 620, 621
See application file for complete search history.

(56) References Cited

U.S. PATENT DOCUMENTS

| 2,798,053 A | 7/1957 | Brown |
| 2,923,962 A | 2/1960 | Ackerman et al. |
| 3,869,454 A | 3/1975 | Lang et al. |
| 3,915,921 A | 10/1975 | Schlatzer, Jr. |
| 3,955,918 A | 5/1976 | Lang |

(Continued)

FOREIGN PATENT DOCUMENTS

EP    0 735 564 A    10/1996

(Continued)

*Primary Examiner*—L. G Lauchman
*Assistant Examiner*—Iyabo S Alli
(74) *Attorney, Agent, or Firm*—Scheinberg & Griner, L.L.P.; Michael O. Scheinberg; Robert McMinn

(57) ABSTRACT

A particle-optical apparatus comprising:
  A first source, for generating a first irradiating beam (E) along a first axis ($A_1$);
  A second source, for generating a second irradiating beam (I) along a second axis ($A_2$) that intersects the first axis at a beam intersection point, the first and second axes ($A_1$, $A_2$) defining a beam plane,
  A stage assembly (3) for positioning a sample in the vicinity of the beam intersection point, provided with:
  A sample table (21) to which the sample can be mounted;
  A set of actuators, arranged so as to effect translation of the sample table along directions substantially parallel to an X-axis perpendicular to the beam plane, a Y-axis parallel to the beam plane, and a Z-axis parallel to the beam plane, said X-axis, Y-axis and Z-axis being mutually orthogonal and passing through the beam intersection point, wherein the set of actuators is further arranged to effect:
  rotation of the sample table about a rotation axis (RA) substantially parallel to the Z-axis, and;
  rotation of the sample table about a flip axis (FA) substantially perpendicular to the Z-axis, whereby the flip axis (FA) can itself be rotated about the rotation axis (RA).

20 Claims, 2 Drawing Sheets

U.S. PATENT DOCUMENTS

| Patent No. | | Date | Inventor |
|---|---|---|---|
| 3,985,499 | A | 10/1976 | Lang et al. |
| 4,025,301 | A | 5/1977 | Lang |
| 4,151,162 | A | 4/1979 | Lang et al. |
| 4,153,065 | A | 5/1979 | Lang |
| 4,228,259 | A | 10/1980 | Kalopissis et al. |
| 4,237,243 | A | 12/1980 | Quack |
| 4,509,949 | A | 4/1985 | Huang et al. |
| 4,740,135 | A | 4/1988 | Shulenberger |
| 4,823,985 | A | 4/1989 | Grollier et al. |
| 5,006,795 | A | 4/1991 | Yoshizawa et al. |
| 5,191,200 | A * | 3/1993 | van der Werf et al. .... 250/201.4 |
| 5,474,578 | A | 12/1995 | Chan et al. |
| 5,708,151 | A | 1/1998 | Mockli |
| 5,852,298 | A | 12/1998 | Hatakeyama et al. |
| 5,879,412 | A | 3/1999 | Rondeau et al. |
| 5,915,910 | A * | 6/1999 | Howells et al. ........ 414/331.17 |
| 5,919,273 | A | 7/1999 | Rondeau et al. |
| 5,976,195 | A | 11/1999 | de la Mettrie et al. |
| 5,989,295 | A | 11/1999 | de la Mettrie et al. |
| 5,993,490 | A | 11/1999 | Rondeau et al. |
| 6,001,135 | A | 12/1999 | Rondeau et al. |
| 6,010,541 | A | 1/2000 | de la Mettrie et al. |
| 6,074,439 | A | 6/2000 | de La Mettrie et al. |
| 6,106,578 | A | 8/2000 | Jones et al. |
| 6,120,780 | A | 9/2000 | Dupuis |
| 6,187,057 | B1 | 2/2001 | Maubru |
| 6,277,155 | B1 | 8/2001 | de La Mettrie et al. |
| 6,344,063 | B1 | 2/2002 | de la Mettrie et al. |
| 6,400,445 | B2 * | 6/2002 | Nishi et al. .................. 356/614 |
| 6,559,461 | B1 | 5/2003 | Seo |
| 6,963,068 | B2 | 11/2005 | Asselbergs et al. |
| 2003/0185664 | A1 | 10/2003 | Mitsui et al. |
| 2004/0245480 | A1 | 12/2004 | Vanderpot et al. |

FOREIGN PATENT DOCUMENTS

| | | |
|---|---|---|
| WO | WO 2005/003736 A | 1/2005 |
| WO | WO 2005/020268 A | 3/2005 |

\* cited by examiner

STAGE ASSEMBLY, PARTICLE-OPTICAL APPARATUS COMPRISING SUCH A STAGE ASSEMBLY, AND METHOD OF TREATING A SAMPLE IN SUCH AN APPARATUS

The invention relates to a stage assembly for positioning a sample in the vicinity of a reference point, provided with:
  A sample table to which the sample can be mounted;
  A set of actuators, arranged so as to effect translation of the sample table along directions substantially parallel to an X-axis perpendicular to a reference plane, a Y-axis parallel to the reference plane, and a Z-axis parallel to the reference plane, said X-axis, Y-axis and Z-axis being mutually orthogonal and passing through the reference point.

The invention also relates to a particle-optical apparatus comprising:
  A first source, for generating a first irradiating beam along a first axis;
  A second source, for generating a second irradiating beam along a second axis that intersects the first axis at a beam intersection point, the first and second axes defining a beam plane;
  A stage assembly as specified in the opening paragraph, wherein the reference point is the beam intersection point and the reference plane is the beam plane.

The first and second irradiating beams referred to in the preceding paragraph may be selected from the group comprising ion beams, electron beams, and laser beams, for example.

A stage assembly and particle-optical apparatus as set forth in the first and second paragraphs above are known from European patent application EP 1 443 541 A. In such an apparatus, which is commonly known as a dual-beam apparatus, an electron beam can be used to perform electron microscopy on a sample mounted on the sample table, whereas an ion beam can be used to subject the sample to certain treatments, such as milling (i.e. the removal of surface layers of material from the sample). Use of dual beams in this manner allows the realization of a single apparatus in which a sample can be treated in situ (using the ion beam), and the results of such treatment can be examined in situ (using the electron beam), easily allowing the sample to be further treated if the results of the examination indicate that this is desirable. In this way, one avoids having to ferry the sample back and forth between a separate electron microscope and ion beam device, thus saving time and effort, and reducing the risk of contamination of the sample by exposure to the atmosphere outside the apparatus.

For example, in the case of a Transmission Electron Microscope (TEM) or a Scanning Transmission Electron Microscope (STEM), it may transpire that a sample initially placed on the sample table has too great an average thickness $T_0$ (in a direction substantially perpendicular to a major surface S of the sample) to be satisfactorily imaged by the electron beam. In such a scenario, an ion beam present in the dual-beam TEM or STEM can be used to thin the sample, by scanning (part on the sample in X, Y with respect to the ion beam so as to mill off a certain thickness $\Delta T$ of material. The (portion of the) sample with new thickness $T_1 = T_0 - \Delta T$ can then be monitored with the electron beam to determine if it can be satisfactorily imaged. If not, the sample can be further thinned using the ion beam, and so forth.

An example of a type of sample that may be used in conjunction with such an apparatus is a piece of a semiconductor device that has been manufactured on a silicon wafer (or other substrate, such as a GaAs crystal, for example). In order to investigate layer thicknesses, gate structure, interconnects, line dimensioning, insulation integrity, etc., in such a device, a tiny piece is cut out of the device in question on the wafer, which piece represents a vertical cross-section through the various layers comprising the device. So as to allow satisfactory imaging, such a piece when viewed on the sample table of a TEM or STEM should have a microscopic thickness of the order of about 1 nm-1 µm (in a direction parallel to the electron beam axis), but will generally present a major surface S of significantly larger dimensions (e.g. ~30×30 µm$^2$) perpendicular to the electron beam axis. Apart from such semiconductor specimens, the sample may also be, for example, a piece of biological tissue, a crystal, etc.

In many prior-art apparatus of the type described above, an electron beam is generated along the first axis, and the Z-axis is fixed so as to be coincident with the first axis. Translation of the sample along the Z-axis then allows the electron beam to be properly focused on the sample, whereas translation of the sample parallel to the X-axis and/or and Y-axis allows different points on the surface of the sample to be laterally positioned at the focus of the electron beam. These same degrees of freedom also allow a given point on the sample to be positioned in the second irradiating beam (e.g. ion beam) (and, if this second irradiating beam is a focused beam (e.g. a FIB), also allow that point to be placed in the focus of the second irradiating beam). Typically, the sample table is embodied to present a mounting plane perpendicular to the Z-axis, and the sample is mounted so that it presents a major surface S substantially parallel to this mounting plane. However, although the electron beam in such a set-up will impinge perpendicularly upon S, the second irradiating beam propagating along the second axis will impinge upon the sample at an angle $\phi$ with respect to the normal to S (because the first and second axes are not parallel). Typically, the value of $\phi$ will be of the order of about 40-60 degrees. For ion milling purposes, for example, relatively large values of $\phi$ are advantageous, since an ion beam at a relatively small value of $\phi$ will tend to create a hole in the sample, whereas an ion beam at a relatively large value of $\phi$ (i.e. better approximating grazing incidence) will be more smeared out over the sample, thus promoting milling rather than drilling.

Since ions in the set-up described above do not impinge perpendicularly upon the sample, the effect of such ions on the sample is necessarily non-isotropic. Consequently, such non-isotropic irradiation with ions may produce substantially inhomogeneous treatment results when the sample is viewed with the electron beam. For example, in a milling treatment, a side of the sample facing the ion beam may be undesirably thinned to a greater extent than an opposite side of the sample. Similar considerations apply when other types of second irradiating beam are employed, such as a laser beam or electron beam.

It is an object of the invention to alleviate this problem. More specifically, it is an object of the invention to provide a stage assembly that allows a sample to be more homogeneously treated in a dual-beam particle-optical apparatus.

These and other objects are achieved in stage assembly as set forth in the opening paragraph, characterized in that the set of actuators is further arranged to effect:
  rotation of the sample table about a rotation axis substantially parallel to the Z-axis, and;
  rotation of the sample table about a flip axis substantially perpendicular to the Z-axis, whereby the flip axis can itself be rotated about the rotation axis.

The term "rotation" in this context refers to a substantial rotation rather than a miniscule tilt, for example. The possible range of each rotation will in any case be greater than 1 degree, for example, and will generally be even greater (e.g. more than 10 degrees, up to a full rotation of 360 degrees).

Accordingly, a particle-optical apparatus according to the invention has the structure set forth in the second opening paragraph above, and comprises a stage assembly according to the invention as described in the penultimate preceding paragraph.

Rotation of the sample about said rotation axis allows the effect of a treatment of the sample (such as an ion treatment) to be rendered rotationally symmetric (about the rotation axis), thus removing—or at least reducing—the non-isotropy/inhomogeneity referred to above. Together with this angular degree of freedom (DOF) about the rotation axis, the further angular DOF provided about the flip axis allows a wide range of specific crystallographic orientations in the sample to be oriented along the first and/or second irradiating beam. In terminology familiar to the skilled artisan in the field of electron microscopy, the combined angular DOFs about the rotation axis and the flip axis allow both $\alpha$-tilt and $\beta$-tilt of the sample.

Similarly, a method as set forth in the fourth opening paragraph is characterized according to the invention in that, during irradiation with the ion beam, the sample is angularly displaced about a rotation axis substantially parallel to the beam plane.

In a particular embodiment of the stage assembly and particle-optical apparatus according to the invention, the set of actuators can additionally effect rotation of the Y-axis and Z-axis about a principal axis coincident with the X-axis. Rotation of the Y-axis and Z-axis about this principal axis allows the angle of incidence (upon the sample) of the first and/or the second irradiating beam to be adjusted. In particular, the angle of incidence $\phi$ of the second irradiating beam (e.g. ion beam) upon the major surface S can now be tuned, so as to optimize the treatment carried out by that beam. Moreover, a rotational DOF about the principal axis allows the creation of a Eucentric coordinate system, in which the various DOFs of the sample table are less degenerate. In a non-Eucentric system, a desired net movement of the sample table in a particular DOF will generally be composed of a whole set of component DOFs, thus complicating actuation and positioning of the sample; said set may, for example, be determined from a matrix that expresses the inter-dependency (degeneracy) of the various DOFs (a so-called compu-centric system).

A particular embodiment of a stage assembly as set forth in the previous paragraph comprises:

A substage that can be translated along a direction parallel to the X-axis;

A principal rotation assembly mounted on the substage, for effecting rotation of a frame about the principal axis;

A Y assembly, carried by the frame, for effecting translation of a sled along a direction parallel to the Y-axis as referenced to the frame;

A Z assembly, carried by the sled, for effecting rotation of a platform about the rotation axis as referenced to the frame, and for effecting translation of the platform along that rotation axis;

A flip assembly, carried by the platform, for effecting rotation of the sample table about the flip axis as referenced to the frame.

The inventors have found that such a set-up allows the additional DOF(s) provided by the invention to be efficiently and accurately realized.

The phrase "as referenced to" as employed in the preceding paragraph, and in similar contexts throughout this text, is used to refer to a situation whereby an axis or a set of axes (defining a coordinate system) is fixed with regard to a internal framework (such as the frame referred to above), even though that internal framework may itself be movable with respect to an external framework (such as the substage and principal rotation assembly referred to above). The internal framework then has its own local coordinate system, within the more global coordinate system of the external framework.

For many applications, the angular stroke of the sample table about the rotation axis need only be about 90 degrees or 180 degrees, for example. In a specific embodiment of the stage assembly and particle-optical apparatus according to the invention, the angular stroke of the sample table about the rotation axis is substantially 360 degrees or more. Such rotation allows all sides of the sample to be presented at will to the second irradiating beam (e.g. ion beam), giving greatest freedom as regards the results that can be achieved by treatment with that beam. One way of achieving such an angular stroke is if the Z assembly referred to in the previous paragraph can continuously rotate the platform about the rotation axis in a given sense; in such a set up, the sample can, if desired, make several revolutions (in the same sense) about the rotation axis during the course of an ion treatment. In an alternative scenario, the angular stroke of the sample about the rotation axis is just less than 360 degrees; in such a set up, the sample can be rotated to the end of its stroke in one sense, and can then be rotated in the opposite sense back to the beginning of its stroke, repeating this back-and-forth rotation as desired during the course of an ion treatment (or other treatment in the case of a different second irradiating beam).

In a particular embodiment of a stage assembly and particle-optical apparatus as set forth above, the angular stroke of the sample table about the flip axis is substantially 360 degrees or more. If the flip axis is arranged to be parallel to the principal axis (by suitable angular adjustment of the stage assembly about the rotation axis), and the second irradiating beam is embodied as an ion beam, such an angular stroke allows the stage assembly to be used as a type of "ion lathe". In such a set-up, one could manufacture various precision items, such as tips and probes that are required to have a particular cylindrical/conical profile about the flip axis. In a similar fashion, one could realize a "laser lathe", using a laser beam as the second irradiating beam. An angular stroke of substantially 360 degrees or more as described here may be realized in manners similar to those set forth in the previous paragraph (but now involving the flip assembly rather than the Z assembly).

It should be noted that, in addition to the sample table described above, the stage assembly according to the invention may also comprise one or more additional sample carriers (different to the sample table). For example, the stage assembly may have a sample carrier for holding/positioning/manipulating a bulk sample (such as an entire semiconductor wafer or a substantial portion thereof, a GaAs crystal, a block of ferrite used as a substrate for a thin-film head, etc.), in addition to a sample table as described above for holding/positioning/manipulating a portion of the bulk sample (such as a cross-sectional portion of a wafer) that is to be further investigated. The sample table and the sample carrier(s) may, for example, be mounted on an exchange mechanism, such as a slider or carrousel, which allows each to be positioned proximal to the reference point (beam intersection point of the first and second axes). When used in a particle-optical apparatus according to the invention, the portion of the bulk sample investigated on the sample table may, if so desired, be cut from the bulk sample using the second irradiating beam (e.g. an ion beam or laser beam) present in the apparatus.

The preceding paragraphs make several references to the use of an ion beam. In this context, it deserves mention that, in addition to ion treatment that involves material removal, one can also conceive ion treatment that involves material augmentation, such as the deposition of matter on the sample via an interaction between the ion beam and a (deliberately introduced) gas-phase substance present at the interface between the ion beam and the sample. In such a scenario, the extra angular DOF provided by the invention about the rotation axis helps to prevent deposition of material in a non-uniform thickness across the exposed surface of the sample, for example.

In a similar fashion, a laser beam can be employed either to remove material from a sample (e.g. via laser ablation), or perform laser-assisted deposition of material on the sample.

The invention and its attendant advantages will be further elucidated on the basis of exemplary embodiments and the accompanying schematic drawings, in which.

In the Figures, corresponding features are indicated by corresponding reference symbols.

EMBODIMENT 1

Figure 1:
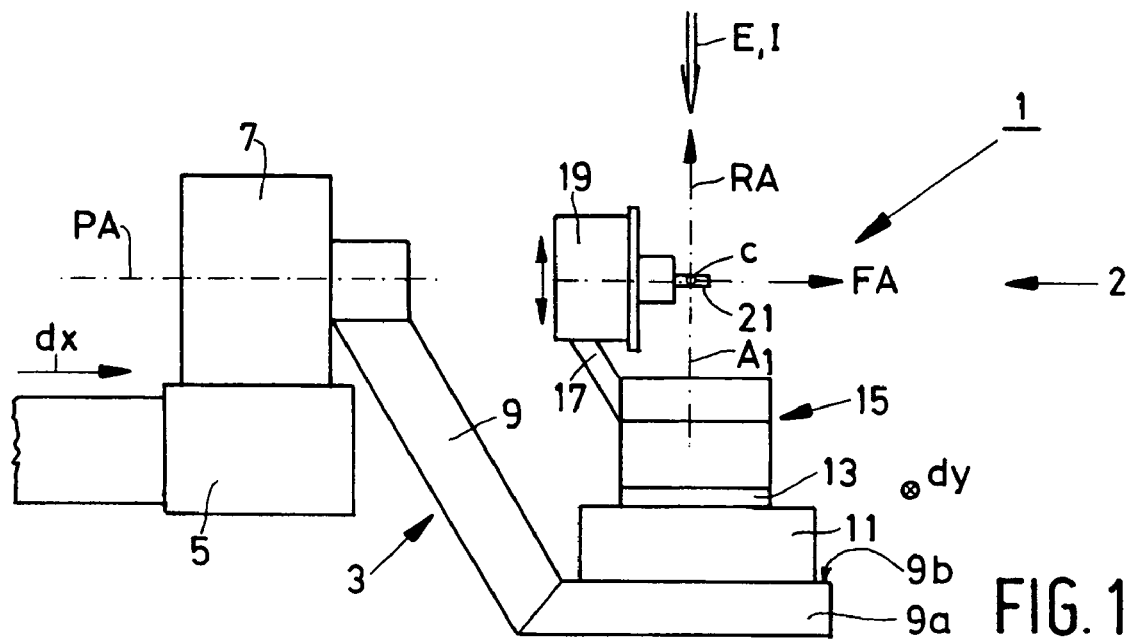
FIG. 1 shows an elevation of part of an embodiment of a stage assembly and particle-optical apparatus according to the invention.

FIG. 1 shows an elevation of part of an embodiment of a particle-optical apparatus 1 and stage assembly 3 according to the invention. In the figure, the stage assembly 3 is comprised of the following components:

A substage 5 that can be translated back and forth along a direction $d_X$ parallel to an X-axis;

A principal rotation assembly 7 mounted on the substage 5, for effecting rotation of a frame 9 about a principal axis PA parallel to the X-axis;

A Y assembly 11, carried by the frame 9, for effecting translation of a sled 13 back and forth along a direction $d_Y$ parallel to a Y-axis as referenced to the frame 9;

A Z assembly 15, carried by the sled 13, for effecting rotation of a platform 17 about a rotation axis RA, and for effecting translation of the platform 17 along that rotation axis RA. The rotation axis RA is parallel to a Z-axis as referenced to the frame 9;

A flip assembly 19, carried by the platform 17, for effecting rotation of a sample table 21 about a flip axis FA. The flip axis FA is perpendicular to the Z-axis as referenced to the frame 9, and can itself be rotated about the rotation axis RA thanks to the rotational functionality of the Z assembly 15.

The X-axis, Y-axis and Z-axis referred to in the previous paragraph are mutually orthogonal, and have a common origin at reference point c. In the depicted embodiment, the X-axis coincides with the principal axis PA, and is fixed. On the other hand, the Y-axis and Z-axis are referenced to the frame 9, and thus co-rotate with the frame 9 when the frame 9 is angularly displaced about the principal axis PA by the principal rotation assembly 7. For example, if the frame 9 comprises a planar portion 9a with a plane 9b that extends parallel to the X-axis and carries the Y assembly 11, then the Y-axis will extend parallel to this plane 9b and the Z-axis will extend perpendicular to this plane 9b, regardless of the rotational orientation of the planar portion 9a about the principal axis PA. Such a co-ordinate system—which can be rotated about the principal axis PA—is referred to in the art as a Eucentric coordinate system.

The reference point c also forms the point of intersection of a first axis $A_1$ and a second axis $A_2$ (see FIG. 2), both of which lie within a beam plane BP (the plane of the drawing sheet in FIG. 2), which beam plane BP is perpendicular to the principal axis PA. The first axis $A_1$ and the second axis $A_2$ are mutually displaced by an angle θ about the point c. A beam E of electrons (first irradiating beam) can be directed along the first axis $A_1$, and a beam I of ions (second irradiating beam) can be directed along the second axis $A_2$, for example. These beams E and I are generated using particle sources and particle optics well known in the art (and thus not depicted here). Both the beams E and I can be focused at point c. The Z assembly 15 can be used to move the sample table 21 into and out of the focus c of the beams.

In a particular embodiment of the stage assembly 3, the linear stroke of the substage 5 and Y assembly 11 is of the order of about 100 mm (i.e. ±50 mm w.r.t. the first axis $A_1$), the linear stroke of the Z assembly 15 is of the order of about 10 mm (allowing the sample table 21 to be displaced ±5 mm w.r.t. the level of the principal axis PA), the rotational range of the principal rotation assembly 7 is at least θ (encompassing both $A_1$ and $A_2$), the angular stroke of the Z assembly 15 is 180 degrees (about the rotational axis RA), and the angular stroke of the flip assembly 19 is also 180 degrees (about the flip axis FA), for example. However, different values of these ranges may, of course, also be chosen.

The Eucentric system described above has the advantage that, in the case of a sample mounted on the sample table 21 and presenting a major surface S substantially parallel to a plane of the sample table 21, the sample table 21 can be manipulated (using the principal rotation assembly 7) so as to adjust the angle subtended at S by either the first axis $A_1$ or the second axis $A_2$.

Figure 2:
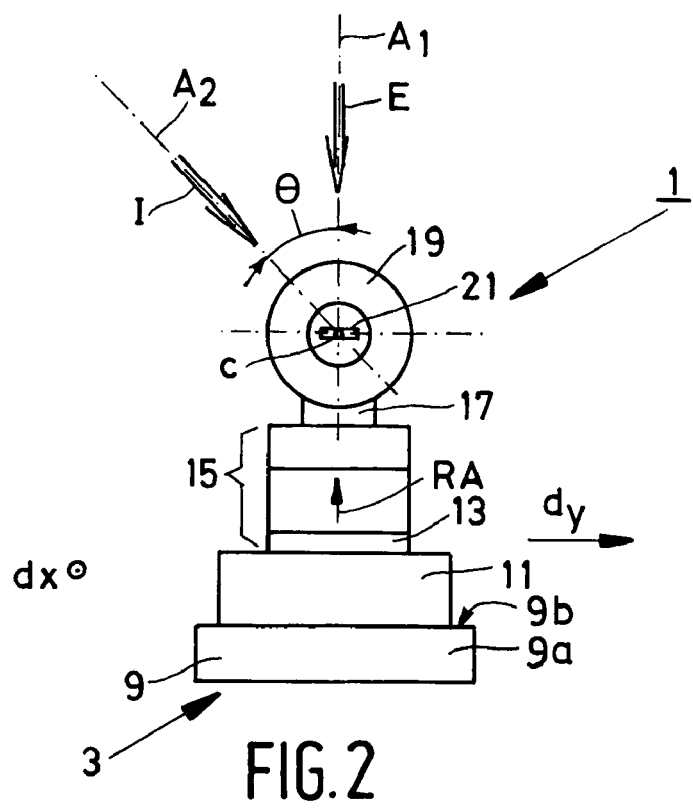
FIG. 2 shows an end view of the subject of FIG. 1, viewed along the direction of the arrow 2 in FIG. 1.
Figure 3:
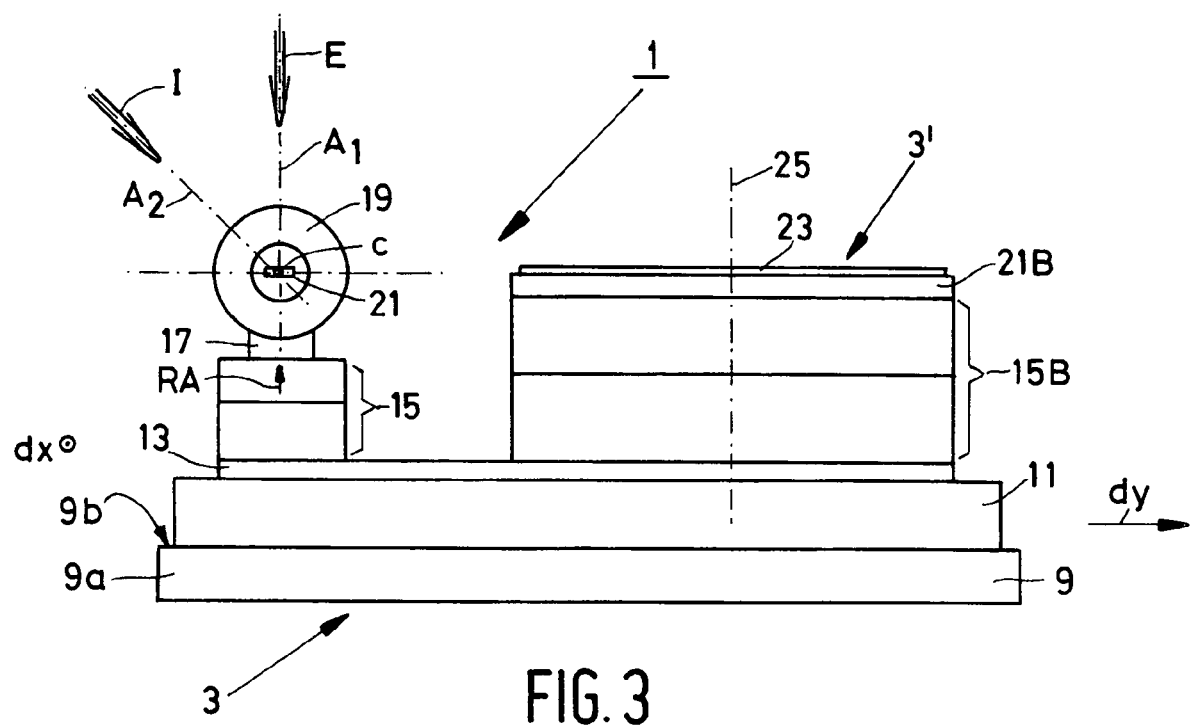
FIG. 3 shows a modification of FIG. 2, featuring a supplemental sample carrier.

As depicted in FIGS. 1 and 2, the flip axis FA coincides with the principal axis PA. However, this is purely coincidental, and the flip axis FA can, if so desired, be made to subtend an angle with the principal axis PA via suitable rotation of the platform 17 about the rotation axis RA (using the Z assembly 15). Moreover, the flip axis FA can be displaced away from the principal axis PA by suitable displacement of the platform 17 along the axis RA (using the Z assembly 15) and/or along the direction $d_Y$ (using the Y assembly 11).

Also, as depicted in FIGS. 1 and 2, the rotational axis RA coincides with the first axis $A_1$. However, this is also purely coincidental, and the rotation axis RA can, if so desired, be made to subtend an angle with the first axis $A_1$ via suitable rotation of the frame 9 about the principal axis PA (using the principal rotation assembly 7). Moreover, the rotational axis RA can be displaced away from the first axis $A_1$ by suitable displacement of the frame 9 along the direction $d_X$ (using the substage 5) and/or along the direction $d_Y$ (using the Y assembly 11).

According to the invention, the sample table 21 can be rotated about the rotation axis RA during irradiation with the ion beam I; this allows a more homogeneous/isotropic processing of a sample on the sample table 21 to be achieved. Moreover, together with this angular degree of freedom (DOF) about the rotation axis RA, the further angular DOF provided about the flip axis FA allows a wide range of specific crystallographic orientations in the sample to be oriented along the first axis $A_1$ and/or the second axis $A_2$, so that both α-tilt and β-tilt of the sample can be achieved/adjusted.

EMBODIMENTS 2

An alternative embodiment of a particle-optical apparatus and stage assembly according to the invention is identical to that described above in Embodiment 1, except in that the frame 9 cannot be rotated about the principal axis PA. In such a set-up—which is non-Eucentric—the rotational axis RA is permanently parallel to, for example, the first axis $A_1$.

EMBODIMENT 3

Another embodiment of a particle-optical apparatus and stage assembly according to the invention is identical to that described above in Embodiment 1, except in that the stage assembly 3 incorporates an additional structure 3' provided on the sled 13. Whereas the sample table 21 in FIGS. 1 and 2 is intended to hold a miniscule sample of microscopic dimensions (e.g. $30\times30\times0.1$ μm$^3$), a sample carrier 21B comprised in the additional structure 3' is intended to hold bulk samples, such as (a substantial portion of) an entire semiconductor wafer (e.g. of diameter 100 mm and thickness 1.2 mm). To this end, the structure 3' comprises a bulk Z assembly 15B, carried by the sled 13, for effecting rotation of the sample carrier 21B about a bulk rotation axis 25, and for effecting translation of the sample carrier 21B along that bulk rotation axis 25. The bulk rotation axis 25 is parallel to the rotation axis RA, and at a fixed distance therefrom. The stroke of the Y assembly 11 in this case is sufficient to allow the bulk rotation axis 25 to be made coincident with the first axis $A_1$. In the case of a Eucentric system, the bulk rotation axis 25 can also be tilted (within the plane of the drawing sheet) so as to be made parallel to the second axis $A_2$.

A bulk sample 23, such as (a substantial portion of) a semiconductor wafer, can be mounted on the sample carrier 21B. The fact that the sample carrier 21B can be angularly adjusted about the bulk rotation axis 25 allows the orientation of the bulk sample 23 to be adjusted; this can, for example, be of advantage if a handler robot used to exchange bulk samples with the sample carrier 21B has an intrinsic placement inaccuracy. After the bulk sample 23 has been loaded on the sample carrier 21B, the Y assembly can be adjusted so as to move the bulk sample 23 underneath the electron beam E, for inspection. Once a particular area of interest has been located on the bulk sample 23 using the electron beam E (after appropriate adjustments to the substage 5, Y assembly 11 and/or bulk Z assembly 15B), a piece of the bulk sample 23 can be removed in situ and transferred to the sample table 21, where it can be processed with the ion beam I (if necessary) and further investigated with the electron beam E. Techniques suitable for such in situ removal and transfer are already known in the art: see, for example, EP 1 443 541 A referred to above.

EMBODIMENTS 4

A further embodiment of a particle-optical apparatus and stage assembly according to the invention is identical to that described above in any of the Embodiments 1-3, except in that the angular stroke of the sample table 21 about the flip axis FA is substantially 360 degrees or more. If the flip axis FA is arranged to be parallel to the principal axis PA (by suitable angular adjustment of the sample table 21 about the rotation axis RA), such an angular stroke allows the sample table 21 to be used as a type of "ion lathe", whereby the sample table 21 is rotated about the flip axis FA during processing by the ion beam I (and, if desired, is also translated along the flip axis FA with the aid of the substage 5).

EMBODIMENTS 5

Another embodiment of a particle-optical apparatus according to the invention is identical to that described above in any of the Embodiments 1-4, except in that the ion beam I (second irradiating beam) is replaced by a laser beam. Alternatively, the electron beam E (first irradiating beam) may be replaced by an ion beam, or a laser beam.

The invention claimed is:

1. A stage assembly for positioning a sample in the vicinity of a reference point, comprising:
    a sample table for mounting a sample; and
    a set of actuators, arranged so as to effect translation of the sample table along directions substantially parallel to an X-axis perpendicular to a reference plane, a Y-axis parallel to the reference plane, and a Z-axis parallel to the reference plane, said X-axis, Y-axis and Z-axis being mutually orthogonal and passing through the reference point, the set of actuators being further arranged to effect:
    rotation of the sample table about a rotation axis substantially parallel to the Z-axis, and;
    rotation of the sample table about a flip axis substantially perpendicular to the Z-axis, in which the flip axis is itself rotatable about the rotation axis.

2. A stage assembly according to claim 1, wherein the set of actuators can additionally effect rotation of the Y-axis and Z-axis about a principal axis coincident with the X-axis.

3. A stage assembly according to claim 2, further comprising:
    a substage translatable along a direction parallel to the X-axis;
    a principal rotation assembly mounted on the substage, for effecting rotation of a frame about the principal axis;
    a Y assembly, carried by the frame, for effecting translation of a sled along a direction parallel to the Y-axis as referenced to the frame;
    a Z assembly, carried by the sled, for effecting rotation of a platform about the rotation axis as referenced to the frame, and for effecting translation of the platform along the rotation axis as referenced to the frame; and
    a flip assembly, carried by the platform, for effecting rotation of the sample table about the flip axis as referenced to the frame.

4. A stage assembly according to claim 1, wherein the angular range of the sample table about the flip axis is substantially 360 degrees or more.

5. A particle-optical apparatus comprising:
    a first source, for generating a first irradiating beam along a first axis;
    a second source, for generating a second irradiating beam along a second axis that intersects the first axis at a beam intersection point the first and second axes defining a beam plane;
    a stage assembly according to claim 1, in which the reference point is the beam intersection point and the reference plane is the beam plane.

6. The stage assembly according to claim 2, wherein the angular range of the sample table about the flip axis is substantially 360 degrees or more.

7. The particle-optical apparatus according to claim 5, wherein the set of actuators can additionally effect rotation of the Y-axis and Z-axis about a principal axis coincident with the X-axis.

8. The particle-optical apparatus according to claim 7, further comprising:
a substage translatable along a direction parallel to the X-axis;
a principal rotation assembly mounted on the substage, for effecting rotation of a frame about the principal axis;
a Y assembly, carried by the frame, for effecting translation of a sled along a direction parallel to the Y-axis as referenced to the frame;
a Z assembly, carried by the sled, for effecting rotation of a platform about the rotation axis as referenced to the frame, and for effecting translation of the platform along the rotation axis as referenced to the frame; and
a flip assembly, carried by the platform, for effecting rotation of the sample table about the flip axis as referenced to the frame.

9. The particle-optical apparatus according to claim 5, wherein the angular stroke of the sample table about the flip axis is substantially 360 degrees or more.

10. A method of treating a sample in the in a charged particle beam system, comprising:
mounting a sample on a sample table;
translating the sample table in three dimensions along an X-axis perpendicular to a reference plane, a Y-axis parallel to the reference plane, and a Z-axis parallel to the reference plane, said X-axis, Y-axis and Z-axis being mutually orthogonal and passing through a reference point;
rotating the sample table about a rotation axis substantially parallel to the Z-axis;
rotating the sample table about a flip axis substantially perpendicular to the Z-axis;
rotating the flip axis about the rotation axis; and
directing a charged particle beam toward the sample.

11. The method according to claim 10, further comprising rotating the Y-axis and Z-axis about a principal axis coincident with the X-axis.

12. The method according to claim 11, further comprising:
translating a substage along a direction parallel to the X-axis;
rotating a frame about the principal axis, using a principal rotation assembly mounted on the substage;
translating a sled, using a Y assembly carried by the frame, along a direction parallel to the Y-axis as referenced to the frame;
rotating a platform, using a Z assembly carried by the sled, about the rotation axis as referenced to the frame;
translating the platform, using the Z assembly carried by the sled, along to rotation axis as referenced to the frame; and
rotating the sample table, using a flip assembly carried by the platform,, about the flip axis as referenced to the frame.

13. The method according to claim 10, where the angular stroke of the sample table about the flip axis is substantially 360 degrees or more.

14. A stage assembly for charged particle beam, comprising:
a flip assembly for holding a sample table and rotating the sample table about a flip assembly axis;
a support supporting the flip assembly, the support being rotatable around a rotational axis, substantially perpendicular to the flip axis, to rotate the flip assembly; and
actuators for causing the flip assembly to translate in three dimensions.

15. The stage assembly of claim 14 further comprising an actuator for rotating the support about a principal axis, perpendicular to the rotational axis.

16. The method according to claim 14, where the angular stroke of the sample table about the flip axis is substantially 360 degrees or more.

17. A stage assembly for positioning a sample, comprising:
a sample table for mounting a sample; and
a set of actuators, arranged so as to effect translation of the sample table along directions substantially parallel to an X-axis perpendicular to a reference plane, a Y-axis parallel to the reference plane, and a Z-axis parallel to the reference plan, said X-axis, Y-axis and Z-axis being mutually orthogonal,
the set of actuators being further arranged to effect:
rotation of the sample table about a rotation axis substantially parallel to the Z-axis, and;
rotation of the sample table about a flip axis substantially perpendicular to the Z-axis, in which the flip axis is itself rotatable about the rotation axis.

18. A stage assembly according to claim 17, wherein the set of actuators can additionally effect rotation of the Y-axis and Z-axis about a principal axis coincident with the X-axis.

19. A stage assembly according to claim 18, further comprising:
a substage translatable along a direction parallel to the X-axis;
a principal rotation assembly mounted on the substage, for effecting rotation of a frame about the principal axis;
a Y assembly, carried by the frame, for effecting translation of a sled along a direction parallel to the Y-axis as referenced to the frame;
a Z assembly, carried by the sled, for effecting rotation of a platform about the rotation axis as referenced to the frame, and for effecting translation of the platform along the rotation axis as referenced to the frame; and
a flip assembly, carried by the platform, for effecting rotation of the sample table about the flip axis as referenced to the frame.

20. A particle-optical apparatus comprising:
a first source, for generating a first irradiating beam along a first axis;
a second source, for generating a second irradiating beam along a second axis that intersects the first axis at a beam intersection point, the first and second axes defining a beam plane;
a stage assembly according to claim 2, in which the reference point is the beam intersection point and the reference plane is the beam plane.

* * * * *